US009647161B2

(12) United States Patent
Buckley et al.

(10) Patent No.: US 9,647,161 B2
(45) Date of Patent: May 9, 2017

(54) METHOD OF MANUFACTURING A DEVICE COMPRISING AN INTEGRATED CIRCUIT AND PHOTOVOLTAIC CELLS

(71) Applicant: COMMISSARIAT A L'ENERGIE ATOMIQUE ET AUX ENE ALT, Paris (FR)

(72) Inventors: Julien Buckley, Grenoble (FR); Haykel Ben Jamaa, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/525,899

(22) Filed: Oct. 28, 2014

(65) Prior Publication Data
US 2015/0115387 A1    Apr. 30, 2015

(30) Foreign Application Priority Data
Oct. 29, 2013   (FR) ..................... 13 60568

(51) Int. Cl.
*H01L 31/18*    (2006.01)
*H01L 31/05*    (2014.01)
(Continued)

(52) U.S. Cl.
CPC ........ *H01L 31/0504* (2013.01); *H01L 25/167* (2013.01); *H01L 31/0475* (2014.12); *H01L 2224/16* (2013.01); *Y02E 10/50* (2013.01)

(58) Field of Classification Search
CPC ..... H01L 31/188; H01L 25/167; H01L 31/05; H01L 31/18; H01L 2224/16
See application file for complete search history.

(56) References Cited

U.S. PATENT DOCUMENTS 5,747,967 A * 5/1998 Muljadi ............. H01M 10/465
                                                     136/293
6,545,211 B1    4/2003 Mimura
(Continued)

FOREIGN PATENT DOCUMENTS

JP          2-111068       4/1990

OTHER PUBLICATIONS

French Preliminary Search Report issued Aug. 14, 2014 in French Application 13 60568, filed on Oct. 29, 2013 ( with English translation of Categories of Cited Documents and Written Opinion).
(Continued)

*Primary Examiner* — Marc Armand
*Assistant Examiner* — Sue Tang
(74) *Attorney, Agent, or Firm* — Oblon, McClelland, Maier & Neustadt, L.L.P.

(57) ABSTRACT

According to one embodiment, the present invention relates to a method for manufacturing a photovoltaic device comprising a photovoltaic cell or a plurality of photovoltaic cells (PV cells) connected to an electronic integrated circuit having at least one electrical contact area. A stack comprising the PV cell(s) is produced separately from the electronic integrated circuit, the electronic integrated circuit is then transferred to said stack comprising the PV cell(s). During this transfer, connection areas carried by the PV cell(s) are brought into contact with matching connection areas carried by the electronic integrated circuit.

5 Claims, 5 Drawing Sheets

(51) Int. Cl.
*H01L 25/16* (2006.01)
*H01L 31/0475* (2014.01)

(56) References Cited

U.S. PATENT DOCUMENTS

| | | | |
|---|---|---|---|
| 2001/0023702 A1* | 9/2001 | Nakagawa | H01L 31/042 136/244 |
| 2005/0145274 A1* | 7/2005 | Polce | H01L 31/048 136/244 |
| 2009/0317938 A1* | 12/2009 | Young | H01L 21/0271 438/80 |
| 2011/0086462 A1* | 4/2011 | Ovshinsky | C23C 16/513 438/72 |
| 2012/0085385 A1* | 4/2012 | Keysar | H01L 25/16 136/244 |
| 2012/0118383 A1 | 5/2012 | Bedell et al. | |
| 2012/0245444 A1 | 9/2012 | Otis et al. | |
| 2013/0260505 A1 | 10/2013 | Bedell et al. | |
| 2014/0183686 A1 | 7/2014 | Bedell et al. | |

OTHER PUBLICATIONS

Mina Danesh et al. "An Autonomous Wireless Sensor Node Incorporating a Solar Cell Antenna for Energy Harvesting" IEEE Transactions on Microwave Theory and Techniques, vol. 59, No. 12, 2011, 10 pages.

J. Lu et al. "Above-CMOS a-Si and CIGS Solar Cells for Powering Autonomous Microsystems", 2010 International Electron Devices Meeting, 2010, 4 pages.

Colby L. Bellew et al. "An SOI Process for Fabrication of Solar Cells, Transistors and Electrostatic Actuators", 2003, 5 pages.

Yutaka Arima et al. "On-chip solar battery structure for CMOS LSI", 2006, 5 pages.

* cited by examiner

METHOD OF MANUFACTURING A DEVICE COMPRISING AN INTEGRATED CIRCUIT AND PHOTOVOLTAIC CELLS

TECHNICAL FIELD OF THE INVENTION

Generally speaking, the present invention relates to the field of photovoltaic cells (PV) and more particularly the integration thereof into electronic circuits so as to produce electronic systems having an autonomous electric supply.

STATE OF THE ART

To produce autonomous electronic systems photovoltaic cells are mostly used to supply these. As the micro-electronic industry searches for an always higher density of integration of the devices it produces, numerous manufacturing methods integrating PV cells and electronic circuits in the same manufacturing cycle have thus been provided. Methods integrating autonomous systems have for example been disclosed in the following publications:

C. L. Bellew, S. Hollar, K. S. J. Pister, "An SOI process for fabrication of solar cells, transistors and electrostatic actuators", proc. of the 12th International Conference on Solid State Sensors, Actuators and Microsystems, 2003, J. Lu, W. Liu, C. H. M. van der Werf, A. Y. Kovalgin, Y. Sun, R. E. I. Schropp, J. Schmitz, "Above-CMOS a-Si and CIGS Solar Cells for Powering Autonomous Microsystems", Proc. of IEDM 2010, pp. 31.3.1-31.3.4.

Y. Arima, M. Ehara, "On-chip solar battery structure for CMOS LSI", IEICE Electronics Express, Vol. 3, No. 13, pp. 287-291, 2006.

Such publications, which are representative of the state of the art in the field of autonomous systems using photovoltaic cells, share a common characteristic which is that the production of the photovoltaic cells is constrained by the method used for manufacturing the other components and more particularly the electronic circuits used, most often circuits of the CMOS type, i.e. the most widely used integrated circuits technology, which is based on the utilisation of complementary transistors (C) of the Metal Oxide semiconductor (MOS) type.

Specifically, the manufacturing of the photovoltaic cells is affected by the doping or temperature constraints of the method of executing the integrated circuit. Such constraints tend to reduce the performances of the photovoltaic cells.

In the publication mentioned above by C. L. Bellew and al., the doping by implantation of the N+ and P+ areas is executed in common for the photovoltaic cell and the transistors source and drain areas. The doping conditions used can be optimum for the transistors or the photovoltaic cell only, but not for both. The choice of the transistors technology is limited and does not make it possible to produce complex circuits using advanced technological nodes or a technology other than the CMOS one (e.g. bipolar or BiCMOS).

In the above mentioned publication by J. Lu and al., the photovoltaic cell used must be executed with an energy budget which does not affect the underlying electronic circuit which limits the manufacturing temperature to about 500° C. Besides, the thickness thereof must not exceed a few microns not to stress the circuit. This prevents using photovoltaic cells requiring manufacturing temperatures above this value or thicker ones, with a more important conversion efficiency.

In the above mentioned publication by Y. Arima and al., the photovoltaic cells is composed of diodes manufactured using a CMOS method. The doping and cell geometry is thus defined according to the constraints of the CMOS method itself with, in particular, low dopings and a small junction surface per surface unit. This leads to cells having a low efficiency, typically of about 2.6%.

Under such conditions, the characteristics of the photovoltaic cells cannot be optimum and reach high performances. This reduces the efficiency of the electric supply to the integrated circuits using the photovoltaic cells.

Thus, one object aimed at by the present invention consists in improving the efficiency of the electric supply to the integrated circuits using photovoltaic cells without however significantly increasing the cost or the complexity thereof.

One object of the invention is thus to remedy such problem.

The other objects, characteristics and advantages of the present invention will appear upon reading the following description and referring to the appended drawings. It should be understood that other advantages can be incorporated herein.

SUMMARY OF THE INVENTION

To reach this objective, one embodiment of the present invention relates to a method for manufacturing a photovoltaic device comprising a photovoltaic cell or a plurality of photovoltaic cells (PV cells) connected to an electronic integrated circuit having at least one electrical contact area. A stack comprising the PV cell(s) is produced separately from the electronic integrated circuit, the electronic integrated circuit is then transferred to said stack comprising the PV cell(s). During this transfer, connection areas carried by the PV cell(s) are brought into contact with matching connection areas carried by the electronic integrated circuit.

According to one embodiment, the method comprises the following steps:

a step of executing a stack comprising the cell or the plurality of PV cells which comprises, for each PV cell, the execution, in a semi-conducting material of at least one and preferably of at least two regions having reverse P and N dopings;

after the step of executing the cell or the plurality of PV cells, a cycle of steps of connection comprising at least executing the first connections comprising at least one receiving area intended to electrically connect the at least one PV cell with at least one electronic integrated circuit;

after the cycle of the steps of connection, a step of transferring, onto said stack comprising the cell or the plurality of PV cells, a previously manufactured electronic integrated circuit, with the step of transfer being executed so as to electrically connect the at least one receiving area with an electrical contact area carried by the electronic integrated circuit;

The invention thus provides a photovoltaic device co-integrated with an electronic circuit and a method for producing same. The invention makes it possible to separately produce the photovoltaic device and the integrated circuit and then to assemble these without making the manufacturing method much more complex. The manufacturing of the PV cell(s) is thus not constrained by the manufacturing of the integrated circuit. More efficient cells can thus be produced, which makes it possible to improve the energy efficiency of the supply of the integrated circuit. In the solutions of the prior art, the PV cells are produced by lithography of layers successively deposited on the integrated circuit, typically from a front face of the latter.

Optionally, the invention may further have at least any one of the following optional characteristics and steps taken separately or in combination:

The receiving area of an integrated circuit and the contact area of the electronic integrated circuit generally comprise, respectively, at least two connection pads for electrically connecting said integrated circuit to at least one PV cell.

Advantageously, the photovoltaic device comprises a plurality of photovoltaic cells (PV cells) and said cycle of steps of connection comprises the execution of a plurality of second electric connections to interconnect the PV cells of said plurality of PV cells. In the case of a device comprising only one PV cell, the device comprises no second connections but only first connections.

Advantageously, the steps of forming first connections and second connections are executed simultaneously. Alternatively, such steps are executed successively.

Advantageously, the step of executing the PV cell or the plurality of PV cells comprises at least the following step, executed from a stack comprising: a substrate topped with an insulating layer and a semi-conducting layer, with the semi-conducting layer comprising at least one upper portion extending from an upper face of the semi-conducting layer and having a P or N doping and a lower portion located under the upper portion and having a P or N doping opposite the doping of the upper portion:

a step of forming of the PV cell(s) by etching the semi-conducting layer (the thickness of the semi-conducting layer is totally or partially etched) so as to form respectively one or more islands separated from each other, each comprising a stack of the lower and upper portions of the semi-conducting layer and having a front face formed by the upper portion, with each island forming a PV cell. Each island thus forms a PN diode.

Advantageously, after the etching of the semi-conducting layer so as to form the island(s) and prior to the step of executing the cycle of the steps of electric connections, the method comprises a step of forming spacers on the sides of each island only The spacers on the sides of the same island are contiguous.

Preferably, the execution of the first connections comprising at least one receiving area for an integrated circuit comprises the execution of at least said receiving area located on the insulating layer.

Advantageously, prior to the step of forming the islands by etching the semi-conducting layer, the semi-conducting layer extends on the whole surface of the substrate.

Preferably, prior to the step of forming the islands by etching the semi-conducting layer, the insulating layer and the semi-conducting layer are flat. Preferably the insulating layer is in contact with the semi-conducting layer. Preferably the insulating layer is in contact with the substrate.

According to one embodiment, the step of forming each island by etching the semi-conducting layer is executed so as to preserve, at the root of each island a contact area formed in said lower portion of the semi-conducting layer and which is not located opposite said upper portion.

Advantageously, the contact area is doped so as to make it electrically conducting.

Advantageously, the photovoltaic device comprises a plurality of PV cells, said cycle of steps of connection comprises the execution of a plurality of second electric connections to interconnect the PV cells of said plurality of PV cells and the step of execution of a plurality of second electric connections to interconnect the PV cells comprises the execution of an electric connection connecting the contact area of a PV cell to said front face of another PV cell.

Advantageously, the execution of at least one first connection forming one receiving area for an integrated circuit comprises the execution of at least one receiving area located on the insulating layer.

According to one embodiment, the step of forming each island by etching the semi-conducting layer is executed so as to stop the etching on the insulating layer out of the island(s). Thus, outside the islands, the semi-conducting layer is totally etched.

According to one embodiment, the photovoltaic device comprises a plurality of PV cells, said cycle of steps of connection comprises the execution of a plurality of second electric connections to interconnect the PV cells of said plurality of PV cells and the execution of a plurality of second electric connections to interconnect the PV cells comprises the following steps:

etching, from a face of the stack comprising the PV cells formed by the islands, the whole thickness of the insulating layer and a part of the thickness of the substrate to form an opening out of each PV cell. Such opening is thus not located opposite the island.

filling said openings with a conducting material which is insulated from the wall of each opening by a film made of an insulating material and forming an electric connection between said conducting material filling the opening and said upper portion of the semi-conducting layer and thus of the PV cell;

thinning the rear face of the substrate which is opposite the face of the substrate facing the PV cells, until the openings, on said rear face, filled with metal which then form through vias are reached;

etching, opposite the PV cells and from the rear face of the substrate, the whole thickness of the insulating layer and of the substrate to form, for each PV cell, an additional opening, with each additional opening extending from the rear face of the substrate and reaching the lower portion of the semi-conducting layer of each PV cell;

filling the additional openings with a conducting material which is insulated from the wall of the additional openings by a film made of insulating material so as to form vias connecting the rear face of the substrate to each PV cell;

depositing, on the rear face of the substrate, a conducting material to electrically connect each one of said through vias connected to the lower portion of a PV cell to a via connected to the upper portion of another PV cell.

According to one embodiment, the photovoltaic device comprises a plurality of PV cells, said cycle of steps of connection comprises the execution of a plurality of second electric connections to interconnect the PV cells of said plurality of PV cells and the execution of a plurality of second electric connections to interconnect the PV cells comprises the following steps:

etching, opposite the PV cells and from the rear face of the substrate, the whole thickness of the insulating layer and the substrate to form two openings for each PV cell, with each opening extending from the rear face and reaching the lower portion of the semi-conducting layer of each PV cell;

doping, for each PV cell, an area of the lower portion whereto one of the two openings leads, with such doping being opposite that of the lower portion;

filling, for each PV cell, the two openings with a conducting material so as to form vias connecting the rear face of the substrate of each PV cell;

forming, on the rear face of the substrate, electric connections so as to electrically connect two by two vias associated with two PV cells and leading to areas of the lower portion having opposite dopings.

Preferably, after etching the two openings for each PV cell and prior to filling, for each PV cell, the two openings with a conducting material, a step of doping is executed, for each PV cell, of an area of the lower portion whereto the other one of the two openings leads, with such doping being opposite that of the lower portion and has a level of doping at least 10 times and preferably at least 100 times greater than that of the lower portion.

According to one embodiment, the execution of at least first connections comprising a receiving area for an integrated circuit comprises the execution of at least said receiving area located on the rear face of the substrate.

Advantageously, the execution of at least first connections comprising a receiving area for an integrated circuit comprises the execution:

of at least one receiving area located on the insulating layer to receive a first integrated circuit on the face of the insulating layer turned opposite the PV cell(s);

of at least one receiving area located on the rear face of the substrate to receive a first integrated circuit on said rear face.

According to one embodiment, the stack comprising a substrate topped with an insulating layer and a semi-conducting layer is a silicon on insulating material (SOI) type substrate wherein the insulating layer is formed of a silicon oxide. A step of doping of the upper face of the semi-conducting layer is executed so that the semi-conducting layer has an upper portion extending from the upper face thereof and having a doping opposite that of said lower portion formed by the rest of the semi-conducting layer.

Alternatively, the stack comprising a substrate topped with an insulating layer is obtained by executing the following steps from a massive substrate made of a semi-conducting material:

N or P type doping of an upper part of the massive substrate to form the insulating layer of said stack;

transferring onto the upper part of a semi-conducting layer having a doping opposite that of the upper part of the massive substrate;

thinning of said transferred semi-conducting layer;

doping of the upper face of said transferred semi-conducting layer so that such transferred semi-conducting layer has an upper portion extending from the upper face thereof and having an opposite doping of a lower portion formed by the rest of said transferred semi-conducting layer.

According to one embodiment, said lower portion is formed of a first thickness portion having a P or N doping and another also P respectively N doped thickness portion but the doping level of which is at least 100 times greater than that of the first portion and is at least equal to 1 atom of the doping species for less than 1,000 atoms of the material forming the semi-conducting layer (P+ respectively N+ doping), with said other portion being located between the insulating layer and said first P respectively N doped thickness portion and wherein said other thickness portion is in contact with the insulating layer and of said first thickness portion.

Advantageously, the P+ doped thickness portion is in contact with the insulating layer and of the P doped thickness portion. The semi-conducting layer is thus a double layer. This has, more particularly, the advantage of ensuring a better resistance access to the P areas of the PV cells.

Advantageously, the transfer of the electronic integrated circuit causes, alone, the connection between the latter and at least some of the PV cells.

According to one embodiment, the photovoltaic device comprises a plurality of PV cells, said cycle of connection steps comprises the execution of a plurality of second electric connections to interconnect the PV cells of said plurality of PV cells and prior to the step of forming islands by etching of the semi-conducting layer to form the PV cells an insulating layer is positioned under the semi-conducting layer and a conducting pad, connected to the lower portion of the semi-conducting layer of the PV cell and extending laterally so as to have at least one first portion located opposite the PV cell and at least one second portion not located opposite the same PV cell, are formed inside the insulating layer and for each PV cell; The execution of a plurality of second electric connections to interconnect the PV cells comprises the following steps:

opening of the insulating layer opposite the second portion of the metallic pad of the PV cell, deposition of a conducting material in the opening and on a part of the side of another PV cell until the upper portion of such other PV cell is reached, so as to execute an electric connection between the lower portion and the upper portion of two PV cells.

The electronic integrated circuit comprises complementary transistors (C) of the Metal Oxide semiconductor (MOS) type. More generally, in the present patent application, the electronic integrated circuit comprises transistors more particularly complementary transistors (C) of the Metal Oxide semiconductor (MOS) type and/or memories and/or batteries and/or passive devices such as capacitances or inductors.

According to another embodiment, the method comprises the following steps:

a step of executing the plurality of PV cells on the surface of a stack; which comprises for each PV cell the execution, in a semi-conducting material, of at least one and preferably at least two contacting region(s) having reverse P or N dopings and supported by a supporting substrate;

after the step of executing the plurality of PV cells, a cycle of steps of connection comprising:

the execution of at least a first connection forming a receiving area so configured as to electrically connect at least one PV cell with at least one electronic integrated circuit;

the execution of a plurality of second electric connections so as to interconnect the PV cells of said plurality of PV cells;

after the cycle of the steps of connection, a step of transferring, onto said stack comprising the plurality of PV cells, a previously manufactured electronic integrated circuit, with the step of transfer being executed so as to electrically connect at least one receiving area with an electrical contact area carried by the electronic integrated circuit;

According to another embodiment, the invention relates to a photovoltaic device comprising one or several photovoltaic cell(s) (PV cells) and at least one electronic integrated circuit connected to the PV cell or to the plurality of PV cells, with the device comprising:
a substrate topped with an insulating layer and a semi-conducting layer positioned on a front face of the insulating layer, with the PV cell or the plurality of PV cells being formed in said semi-conducting layer;
wherein it comprises electric connections comprising at least one receiving area so configured as to connect at least one PV cell with at least one electronic integrated circuit;
and in that said at least one electronic integrated circuit is positioned in contact with the receiving area.

Thus, the PV cells and the electronic integrated circuit are positioned opposite the front face of the insulating layer.

Optionally, at least one receiving area is located opposite the front face of the insulating layer and said at least one electronic integrated circuit is positioned in contact with the at least one receiving area opposite the front face of the insulating layer.

Optionally, a photovoltaic device comprises a plurality of photovoltaic cells (PV cells) and said front face of the insulating layer carries electric connections to interconnect the PV cells of said plurality of PV cells.

Optionally, a photovoltaic device comprises an additional electronic integrated circuit positioned opposite a rear face of the substrate, connected to the PV cell(s) so that said insulating layer is positioned between two electronic integrated circuits. Such structure is particularly advantageous in that it offers a high capacity of integration.

Optionally, said receiving areas make it possible to connect, alone, the electronic integrated circuit with at least some of the PV cells.

Another object of the present invention relates to micro-electronic equipment comprising at least one photovoltaic device according to the invention. Micro-electronic equipment means any type of equipment produced using micro-electronic means. Such equipment more particularly include, in addition to devices having a purely electronic finality, micro-mechanical or electro-mechanical devices (MEMS, NEMS . . . ) as well as optical or opto-electronic devices (MOEMS . . . ).

BRIEF DESCRIPTION OF THE FIGURES

The aims, objects, characteristics and advantages of the invention will be more easily understood upon reading the detailed description of an embodiment of the latter which is illustrated by the following appended drawings, wherein.

Figure 1A:
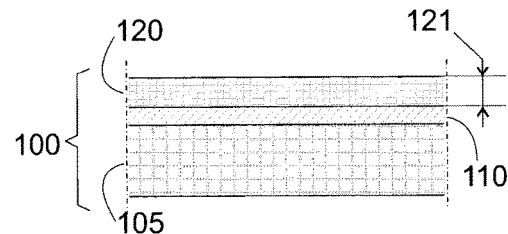
FIGS. 1a to 1h illustrate a first embodiment of the invention wherein one or several island(s) of photovoltaic cells (PV) and the metallic connections between the PV cells are executed on the surface of a substrate which may receive an integrated circuit.

The figures are given as examples and are not restrictive to the invention. They are principle schematic representations intended to facilitate the understanding of the invention and are thus not necessarily at the same scale as the practical applications. More particularly, the relative thicknesses of the various layers and films are not representative of reality.

DETAILED DESCRIPTION OF THE INVENTION

It should be noted that in the present invention, the words « on », « is deposited over » or « underlying » or the equivalent thereof do not mean « in contact with » . Thus, for instance, depositing a first layer onto a second layer does not necessarily mean that the two layers are directly in contact with each other, but this means that the first layer at least partially covers the second layer by being either directly in contact therewith or by being separated therefrom by at least another layer or at least another element.

In the present invention P or N doping types will be mentioned. Such dopings are not restrictive examples. The invention covers all the embodiments wherein doping is reversed. Thus, an exemplary embodiment mentions a P doping for a first area and a N doping for a second area, the present description then describes, at least implicitly, a reverse example wherein the first area has a N doping and the second area a P doping.

Conventionally, a P+ doping means that it is a doping of the P type (doping by positive charges) and the doping species content of which is greater than or equal to 1 atom of the doping species for less than 1,000 atoms of the semi-conductor and preferably for less than 10 to 100 atoms of the material forming the semi-conducting layer. Similarly, a N+ doping means that it is a doping of the N type (doping by negative charges) and the doping species content of which is greater than or equal to 1 atom of the doping species for less than 1,000 atoms of the semi-conductor and preferably for less than 100 à 1,000 atoms of the material forming the semi-conducting layer.

In the present patent application, a P doping encompasses all the dopings by carriers of positive charges whatever the content of the doping. Thus, a P doping comprises the contents in P+ doping and the contents in P doping lower than the doping of the P+ type. Similarly, a N doping encompasses all the dopings by carriers of negative charges whatever the content of the doping. Thus, a N doping comprises the contents in N+ doping and the contents in N doping lower than the doping of the N+ type.

In the present patent application the thickness is measured along a direction perpendicular to the main faces of the substrate whereon the various layers are positioned. In the Figures, the thickness is measured along the vertical.

Similarly when the text mentions that an element is located opposite another element, this means that such two elements are both located on the same line perpendicular to the main plane of the substrate, i.e. on the same line oriented vertically in the Figures.

The invention describes a method which makes it possible to produce the photovoltaic cells separately, without being affected by the constraints of the production of the other circuits, typically those of an integrated circuit of the CMOS type, while making it possible to assemble components forming the produced autonomous system very densely.

FIGS. 1a to 1h describe a first embodiment of the invention wherein, on the one hand, one or several islands of photovoltaic cells (PV), and on the other hand, the metallic connections between the PV cells are executed on the surface. This embodiment offers the advantage of making it possible to unrestrictively connect the PV cells in series and in parallel so as to optimise, according to the function of the desired application, the voltage output of the thus executed PV system, the current supplied and the yield thereof. The cost is low since all the metallic connections are produced with the standard methods of the semi-conductor industry during the so-called BEOL operations, the acronym for « back-end of line» which refers to the « end of line» operations of production during which the metallic interconnections between the components of the produced devices are executed. As regards the surface, the solution is compact, too, since it takes advantage of the progress of the semi-conductor industry which constantly improves the integration of the produced devices FIG. 1a shows the starting point of this first embodiment which is a sophisticated substrate of the SOI type 100, the acronym for « silicon on insulator» i.e. « silicon on insulating material» . As a matter of fact, this type of substrate, which is conventionally manufactured by the semi-conductor industry, comprises a « buried oxide layer» also called « BOX» 110.

This type of substrate makes it possible to produce components in the preferably monocrystalline silicon layer 120 located above the oxide layer 110. The upper layers, 110 and 120 of the substrate SOI 100 rest on a so-called « bulk» massive substrate 105 which gives the assembly the mechanical properties required for being handled easily in a production line of the type of those implemented by the semi-conductor industry.

In this not restrictive example, the silicon layer 120 is a « P» type doped one. It has a thickness 121 ranging from 10 to 160 μm (1 μm or micron=$10^{-6}$ meter). It preferably has a thickness of 80 μm.

If no SOI substrate meeting the above specifications is available, it is possible to start from a simple substrate of the surface-oxidized « bulk» type. Another P type doped, also previously surface-oxidized « bulk» substrate is then transferred by gluing A molecular gluing is then executed between the two oxides. Then, the transferred substrate is thinned, in order to leave only a thickness of 10 to 160 μm of P type silicon, and preferably a thickness of 80 μm, as mentioned above. Such technique makes it possible to reconstitute a suitable SOI substrate equivalent to the structure 100 from two "bulk" substrates.

Whatever the method used for obtaining the substrate forming the structure 100, as shown in FIG. 1 b, a « N» type doping is then executed by ionic implantation and diffusion annealing on a depth 123 of the layer 120, from the surface. For example, such depth is ranging from 0.5 to 5 μm. A continuous interface of PN diode type is thus created, wherein the PV cells will then be formed.

Figure 1B:
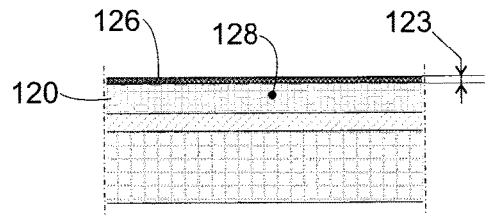

The N+ doped portion bears reference 126 and the P doped portion bears reference 128 in FIG. 1b.

Figure 1C:
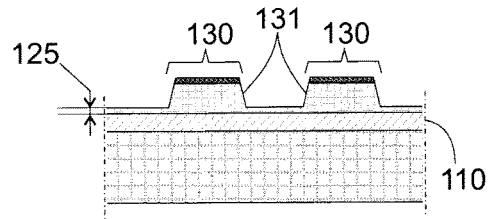

For this purpose, as illustrated in FIG. 1c, the layer 120 is conventionally structured by lithography and etching in order to isolate islands 130 of the PV cells. In the present description, structuring will mean a series of steps making it possible to obtain a pattern protruding from or embossed in a layer, with such steps comprising a lithography involving, for example the deposition of a resin layer, the cutting of openings in the resin, through a mask for example, and then etching through the openings Without a selective barrier layer, etching stops, in this step of the method, according to time, in order to leave, outside the islands 130, a residual thickness 125 of the layer 120 ranging from 0.1 to 10 μm, above the buried oxide (BOX) layer 110. Etching may be of the so-called « wet» , type for example using a potassium hydroxide-based (KOH) solution in which case the etching is isotropic and slanting sides are obtained, as shown. The inclination of such sides comes from the fact that some wet etchings, such as the KOH-based one, follow preferred directions of the crystalline planes of silicon as the etching progresses. In a top view, the etching pattern obtained from an opening, for example, a square in the resin, is also a square the surface of which decreases as the etching goes deeper. The reduction ratio is given by the inclination of the preferred crystalline plane of the etching as compared to the plane of the plate. In a cross-sectional view, the etching pattern is thus a trapezoid having slanting and linear sides reflecting the preferred etching angle. At the roots of the patterns, a solid obtuse angle reflecting the crossing of the two preferred adjacent etching planes is macroscopically obtained. A so-called « dry» etching of the plasma type may also be used, which is anisotropic, to obtain sides perpendicular to the plane of the substrate.

Figure 1D:
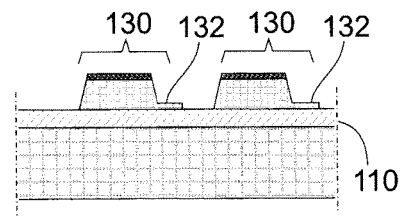

FIG. 1d shows the result of the following step wherein the layer 120 is more structured, by conventional lithography and etching as mentioned above, in order to complete the insulation of the islands 130 from each other. The etching may be stopped, during such step, by detection of the BOX layer 110. The lithography and the etching are executed so as to leave a contact area 132 with each island. It should be noted here that the insulation between the islands is provided by the BOX layer 110 which supports all the PVD islands 130.

Figure 1E:
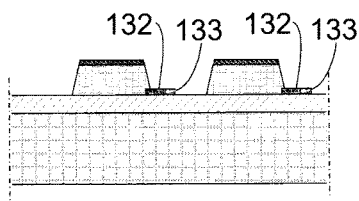

During the following step, the result of which is illustrated in FIG. 1e, the contact areas 132 are doped. For this purpose, the layer 120 is structured again by lithography to make it possible to dope 133 the contact areas 132 of the islands. The doping is of P+ type, i.e. it corresponds to a high level of doping which provides a low electric resistance of such contact areas. A diffusion annealing is provided after the step of doping.

Figure 1F:
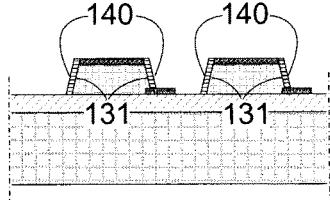

A « full plate» deposition using an insulating material is then executed on the whole surface of the substrate which is etched anisotropically to form spacers 140 on the sides 131 of the islands. The result of such operations is illustrated in FIG. 1f. In some cases, the angle of the slanting sides may affect the definition of regular spacers, which could be etched at the same time as the rest of the insulating material layer during the anisotropic etching. In this case, lithography patterns can be defined in the resin, which cover the sides during the etching, and make it possible to target the etching of the insulating material layer on the whole plate by excluding the spacers on the sides.

Figure 1G:
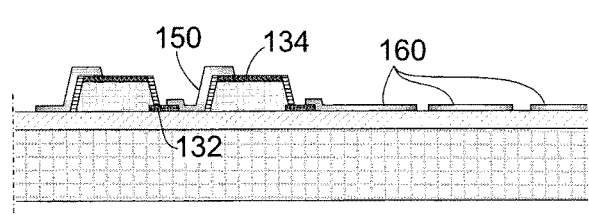

A metal which is conventionally structured by lithography and etching is deposited to produce, as shown in FIG. 1g, connections 150 which connect the N 134 and P 132 areas of two different islands and thus connect them in series. The islands may also be connected in parallel by separately connecting the N areas and the P areas of two different islands.

Particularly advantageously, during such step receiving areas 160, also called receiving pads 160, are produced too. Such receiving areas 160 are intended to receive an external electronic integrated circuit 170, for example of the CMOS type, which can be connected to the PV device that has just been described. Alternatively, such receiving areas 160 may be executed prior to or after forming the connections 150 connecting the PV cells together. However, such receiving areas 160 like the connections 150 connecting the PV cells together are produced after forming the PV cells.

In the present invention, the connections forming the receiving areas for the connection of one or several PV cell(s) with the integrated circuit are called first connections and the electric connections for interconnecting the PV cells are called second connections.

Figure 1H:
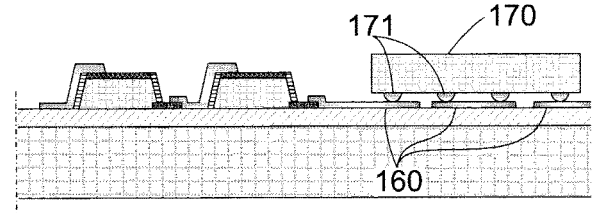

FIG. 1*h* shows how an external integrated circuit 170 can be transferred onto the substrate containing the photovoltaic islands using, for example, as shown, the so-called « flip chip » technique or using any other transfer and connectics technique, such as the so-called « wire-bonding » technique. Such techniques are well-known to the persons skilled in the art and of current practice in the microelectronics industry.

Advantageously, the electronic integrated circuit 170 is produced independently of the PV device comprising the substrate 105 and the PV cells. The integrated circuit 170 may be produced before, during or after the manufacturing of the PV device. It is mechanically transferred and electrically connected to the latter at the receiving areas 160 carried by the integrated circuit 170. Typically the integrated circuit 170 comprises contact pads 171 complementary to the receiving areas 160. In the example illustrated, the contact pads 171 carried by the electronic integrated circuit 170 are for example metallic pads or balls, for example made of indium or tin or copper, or copper, silver and tin alloy, with optionally an anti-corrosion finish such as gold or nickel. They can, for example melt or adhere to the contact areas 160 by reflow. Depending on the type of metal and of the finish of the contacts 171, the contacts 160 are so executed and prepared as to be able to host the contacts 171.

A device is thus obtained, which comprises the integrated circuit 170 and the PV device in a simple and reproducible way and without, however, the manufacturing of the PV device being constrained by the manufacturing of the integrated circuit 170.

An alternative implementation of the invention, which does not require to start from a SOI structure such as 100, is disclosed in FIGS. 2*a* to 2*d*.

Figure 2A:
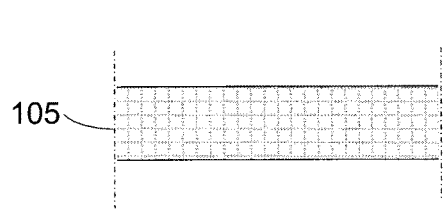
FIGS. 2a to 2d illustrate an alternative embodiment which does not require to start from a silicon on insulating material (SOI) structure.

As shown in FIG. 2*a* the starting point is then a simple substrate of the « bulk » type 105.

Figure 2B:
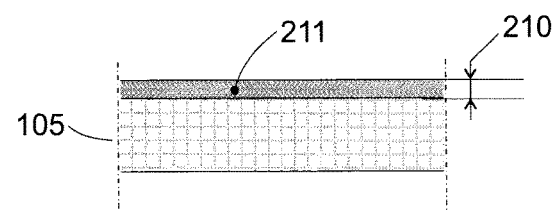

Then, as shown in FIG. 2*b*, a N type doping is executed on the surface of the substrate 105. Doping is executed on a depth 210 ranging from 0.1 to 10 µm after a diffusion annealing. The N doped part bears reference 211 in FIG. 2*b*.

Figure 2C:
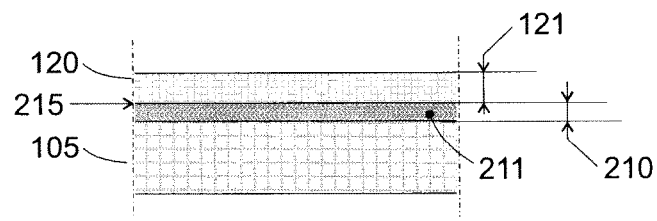
Figure 2D:
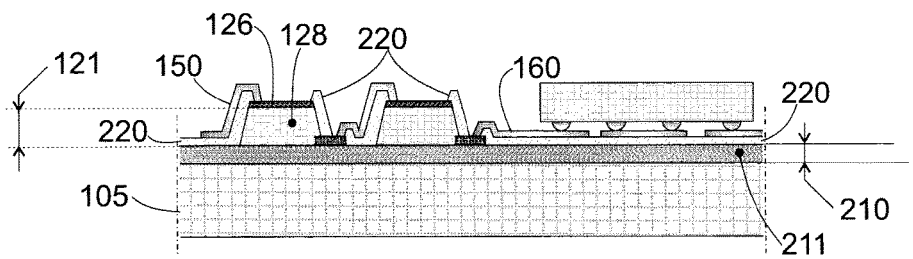

During the following step, the result of which is illustrated in FIG. 2*c*, another P doped « bulk » type substrate is transferred. The assembling of the two substrates is obtained here too by molecular gluing at the interface 215. Then, the substrate transferred is thinned to leave, as mentioned above, only a P type silicon layer 120 having a thickness 121 ranging for example from 10 to 160 µm and preferably having a thickness of 80 µm.

The steps corresponding to FIGS. 1*b* to 1*e* are then executed as disclosed in such Figures. Upon completion of the step corresponding to FIG. 1*e*, instead of the step corresponding to FIG. 1*f* wherein the spacers were formed, insulating material 220 is deposited and structured by lithography to open contacts on N and P silicon areas of the islands. The final structure obtained is the one shown in FIG. 2*d*. In such structure, the spacers, providing electric insulation, are defined at the same time as the rest of the insulation of the structure, to keep only the contact openings as electric access points.

From FIG. 2*c* on, the step 2*d* must be executed first, with a deposition of insulating material 220 before resuming steps 1*f* to 1*h*. As a matter of fact, in the step 1*f* the PV islands are electrically insulated « at the bottom » by the layer 110 which is an oxide. In the step 2*d*, the PV cells are electrically insulated « at the bottom » by a reversed n-p junction (layers 211 and 128). A metal deposited directly from above (such as 150 for example) would cause leakage currents and undesirable potentials toward the layer 211. This demonstrates the interest of a global insulation as described in the steps 2*d*.

It should be noted here that, for this alternative implementation of the invention, which does not require to start from a SOI structure, the PV cells, instead of being insulated from the silicon of the substrate by the BOX layer 110, are insulated by the area with no load at the interface between the layer of N type doped silicon 210 and the P type doped layer 120 above, having a thickness 121. To create the depleted area in this case, a positive potential on the N layer, i.e. higher than that of the P layer located above, is preferably applied either through dedicated contacts, not shown in FIG. 2*d* but which may be executed by standard contact steps, or through the silicon substrate 105.

Figure 3:
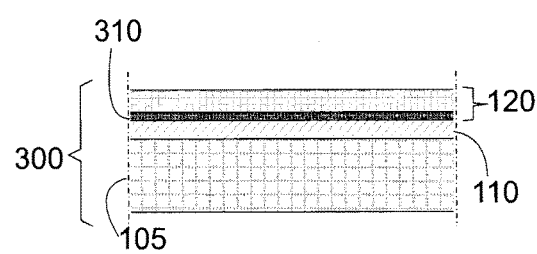
FIG. 3 illustrates an additional option of the first embodiment of the invention.

FIG. 3 illustrates an additional option of the first embodiment of the invention, described above in FIGS. 1 and 2.

In this option the starting SOI structure 300 comprises an upper silicon layer 120, i.e. the P type layer, wherein the photovoltaic islands are executed, which is a double one and includes a highly doped layer 310, of the P+ type, which comes in contact with the BOX layer 110. This more complex structure, which provides a better access resistance to P areas of the PV cells, may be executed by transfer of successive layers and molecular gluing or by epitaxy.

Alternatively, we can also start from a doped « bulk » substrate of the N type on the surface, as disclosed in FIG. 2*b*, whereon a double layer, P on P+ is transferred. The P+ layer is then, in this case, in contact with the N type layer 210, of the substrate. Alternatively, as mentioned above, the P and P+ layers may be executed by epitaxy.

In each one of the above options it is no longer necessary to define the contact areas 132, of the P+ type by etching, with no barrier layer, followed by a doping and a diffusion of the dopants, as disclosed in FIG. 1*e*. As a matter of fact, in this case, the P+ layer is already present on the whole surface of the base of each one of the PV islands and not only on one end, as shown in FIGS. 1 and 2.

FIGS. 4*a* to 4*j* disclose a first embodiment of the invention which integrates vertical through connections of the TSV type, the acronym for « through silicon vias », which refers to a technique developed by the semi-conductor industry to connect a stack of chips using vias able to go through the thickness of a substrate. Such embodiment more particularly offers the following advantages:

The assembling of the external integrated circuit may be executed on the lower face of the substrate if required.

The connection between the P and N areas of two PV cells may be provided by means of through vias (TSV).

This first embodiment may be more compact than the one disclosed in the preceding Figures according to the diameter of the executed TSVs. It also has the advantage of not requiring the etching without a barrier layer used for defining the contact areas 132 in FIGS. 1*d* and 1*e* of the first embodiment. Besides, this embodiment offers the possibility of hosting one or several external circuit(s) located on one or both faces of the substrate.

Figure 4A:
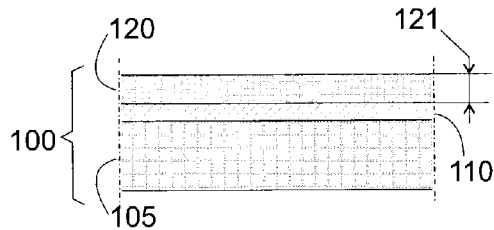
FIGS. 4a to 4j describe a first embodiment of the invention which integrates vertical through connections of the TSV type.

FIG. 4a shows the starting substrate which is, as mentioned above, a SOI type substrate 100 comprising a layer 120 of P doped silicon having a thickness 121 ranging from 10 to 160 μm, and preferably having a thickness of 80 μm.

Figure 4F:
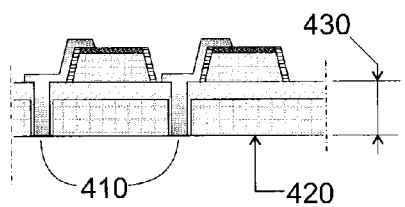
Figure 4B:
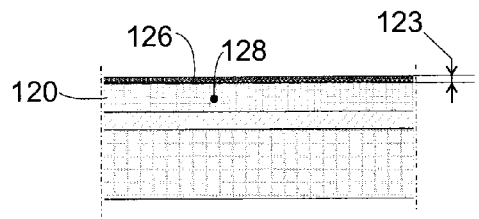

Similarly to the first embodiment, as shown in FIG. 4b, a N type doping of the layer 120 is executed by ionic implantation and diffusion annealing on a depth 123 ranging from 0.5 to 5 μm. The N doped portion bears reference 126 and the P doped portion bears reference 128 in FIG. 4b.

Figure 4G:
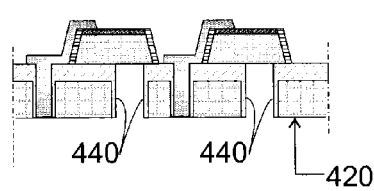
Figure 4C:
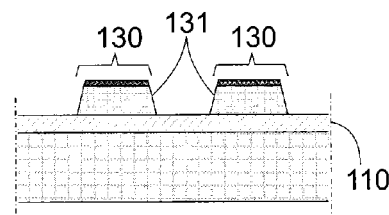

As shown in FIG. 4c the layer 120 is structured by lithography and etched to produce the PV cells islands 130. In this case, the etching stops on the BOX layer 110. As mentioned above, the etching may be «wet» and use, for example, a KOH-based solution, in which case the etching is isotropic and slanting sides 131 are obtained, as shown. The etching may also be «dry» and anisotropic, in which case sides perpendicular to the plane of the substrate are obtained.

Figure 4H:
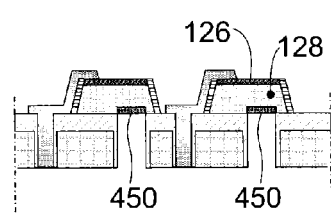
Figure 4D:
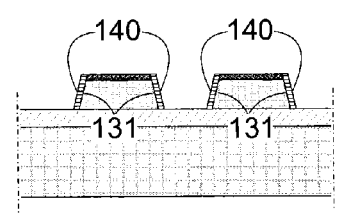

FIG. 4d illustrates the execution of the spacers 140. As disclosed above in FIG. 1f, a layer of insulating material is deposited on the whole surface of the substrate and then it is etched anisotropically so as to form the spacers 140 on the sides 131 of the islands.

Figure 4I:
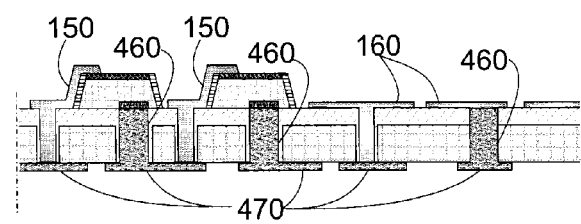
Figure 4E:
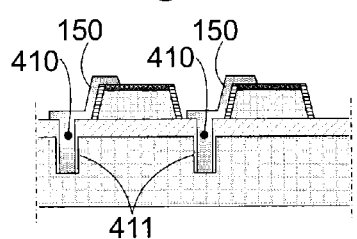

The following step, the result of which is illustrated in FIG. 4e, consists in executing, from the front face, so-called «Middle TSVs» or «intermediary TSVs» vias 410. For this purpose, a deep etching is executed in the silicon intended to host the TSVs being produced. Such deep etching is executed in one direction perpendicular to the substrate and between the islands 130. Insulating material is then correspondingly deposited, i.e. using a method making is possible to deposit a substantially identical thickness whatever the orientation of the surface whereon the deposition is executed. An insulating layer 411 thus covers the side of the etching. One or several step's) of etching are then executed to expose the insulating material on the N areas, and also preferably the insulating material at the bottom of the vias of the «Intermediary TSVs». Such step may be executed with or without lithography. In the latter case, it is known as «etch back». An «etch-back» type etching is executed on a surface having a given topology and coated with a layer. The topology results in the etching not acting similarly at the bottom and on the edges of the cavities. By optimising the parameters of the etching method, it is thus possible to etch the layer at the bottom of the cavity while leaving at least one part of the layer on the edges of the cavity.

The TSVs are then filled with metal, for example copper (Cu). The utilisation of copper results in that anti-diffusion layers, not shown, may have to be deposited between the metal of the TSV and the insulating material thereof. The TSVs and the lateral metallic lines 150, 160 may be structured during this step by a so-called «lift-off» technique, which a technique commonly applied by the semi-conductor industry and which consists in «lifting» the metal which must not remain in place when forming the metallic lines. The lateral metallic lines 150, 160 are respectively the connections 150 between a PV cell and a TSV and a receiving area 160 for receiving an external circuit 170.

During the following step, illustrated by FIG. 4f, the substrate is glued on a temporary handle, not shown, and is thinned from the rear face 420 until the «Middle TSVs» 410 lead to this face. The final thickness 430 may be within a range of thickness from 1 to 300 μm.

Then, as illustrated in FIG. 4g, a deep etching is executed from the rear face 420. Such deep etching is executed in one direction perpendicular to the substrate and opposite the islands 130 so that the islands 130 are reached. Preferably the etching reaches each island. Insulating material is deposited and anisotropically etched using a so-called «etch-back» etching, in order to keep the insulating material on the vertical sides 440 only.

During the following step, the result of which is illustrated in FIG. 4h, an implantation is executed from the rear face so as to execute a P+ type doping of the areas 450 which will enable to provide a good electrical contact with the P area of the PV islands. Activation, i.e. making dopants electrically active in a semi-conductor, may be executed using laser or fast-annealing. To execute such activation at the bottom of the holes, an embodiment consists in briefly exposing the lower surface to a powerful laser beam which heats the surface locally to high temperatures and at depths of less than 5 μm, or less than 100 nm. The local melting of the surface activates the dopants. Such step may also melt structures copper 410 on the surface. If the environment in the method chamber is dry and with no oxygen, the structures 410 are not affected by such activation. On the contrary, they may slightly oxide on the surface, in which case a step of copper 410 stripping should be executed by short copper oxide etching.

As shown in FIG. 4i the deep etchings which have been executed from such face are then filled, from the rear face 420, in order to form new TSVs, called «Last TSVs» 460. Metallic interconnection lines 470 may be simultaneously provided on the rear face. The TSVs and the metallic lines may be structured by «lift-off». Some of the metallic interconnections 470 are used to electrically connect the PV cells together. Such metallic interconnections bear reference 471. More precisely, each connection 471 extends in a plane substantially parallel to the surface of the substrate and electrically connects a Middle TSV connected to a first island 130 to a Last TSV connected to a first island 130 which is preferably adjacent to the first island 130.

Other ones among the metallic interconnections 470 form receiving areas 472 to electrically connect the PV cells with an external integrated circuit 480 transferred onto the rear face of the substrate 105.

Figure 4J:
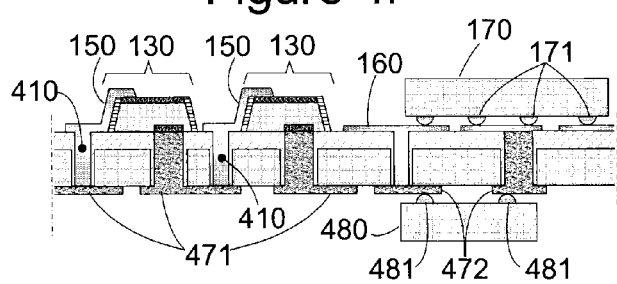

FIG. 4j illustrates the fact that integrated circuits, 170 and 480, can then be transferred, optionally, on both faces of the stack containing the photovoltaic islands 130. This may be done, for example using, as shown, the so-called «flipchip» technique or using any other transfer and connectics technique such as «wire-bonding».

The assembling techniques are different and depend on costs, the easy handling of thinned chips and plates, as well as the required accuracy of alignment. The integrated circuit 170 may be transferred into «plate chips», i.e. assembling equipment transfers integrated circuits 170 to each mark prior to cutting the plate hosting the PV cells. At this stage, the substrate of the PV cells is thinned and carried by a temporary handle. The feasibility of such assembling has been proven on a thickness of the thinned plate of about 50 μm in industrial assembling companies or research and development centres. Further to such step, the thinned plate is removed from the temporary handle and transferred onto the «tape» and fixed to a «frame» which provides the rigidity required for the following handling. Then, the PV cells and integrated circuit 170 sub-systems are cut and removed from the «tape». Then, a «pick and place» operation makes it possible to turn the PV cells and integrated circuits sub-systems and assemble the circuit 480 on the opposite face.

Various options concerning the first embodiment of the invention, illustrated in FIGS. 4a to 4j, are described hereunder. Generally, the options already disclosed for the first embodiment can apply.

The options relating to the substrate are identical. As described above, the structure SOI 100 can be obtained by molecular gluing of «bulk» substrates. The option disclosed in FIG. 2, wherein a doped layer 210 is substituted for the BOX layer 110 can also apply. The final structure obtained (FIG. 4j) is modified accordingly.

In the steps corresponding to FIGS. 4e and 4i, relating to the options relating to the lateral metallization, it is possible to execute the TSV and the metallic lines 150, 160 not simultaneously but in successive steps. As a matter of fact, in the example described in FIG. 4, the vias 410 and the metallic interconnections 150, 160 are simultaneously executed, but this is not compulsory. Similarly, in FIG. 4i, the vias 460 and the metallic interconnections 470 are simultaneously executed but this is not compulsory. Such modification does not change the structure obtained which is illustrated in FIG. 4j.

As regards the optional execution of the «Middle TSVs» 410, it is possible to execute such TSVs before structuring the PV cells islands 130. For this purpose, the option wherein the structure SOI 100 is obtained by gluing the «bulk», substrates is used. In this case, we start from the substrate 105 and the TSVs are etched therein with the filling with the insulating material 411, the anti-diffusion layer and the metal of the TSVs. Then a «mechanical-chemical» flattening, of the so-called CMP, the acronym for «chemical mechanical polishing» type is executed. This operation may be followed by a fine chemical flattening. An oxidized P type «bulk» substrate is then transferred by gluing. A molecular gluing is then executed between the two oxides. Then, the transferred substrate is thinned, as described above, in order to leave only a thickness of 10 to 160 μm of P type silicon, and preferably a thickness of 80 μm. The islands are then formed in this layer of P type silicon. The other steps of the method which apply are described in FIG. 4. Of course, during the step 4e the lateral metallisations forming the receiving areas 160 and the connections 150 between PV cells and TSC only are defined since the Middle TSVs have already been formed.

Another way of executing the «Middle TSVs» prior to structuring the PV cells islands consists in starting from the substrate option wherein there is no BOX layer 110 but a doped layer 210 as described in FIG. 2b. In this case, we start from the substrate 105 whereon an N doped layer has already been created on the surface on a depth ranging from 0.1 to 10 μm. The TSVs are then etched therein with the filling with the insulating material, the anti-diffusion layer and the metal of the TSVs. Then, as mentioned above, a CMP type flattening is executed, which is optionally followed by a fine chemical flattening. Then a P type substrate is transferred, which is assembled by molecular gluing. As mentioned above, the transferred substrate is then thinned. Insulating material is then deposited too, and structured by lithography to open contacts toward the N and P areas of the islands as described in FIG. 2. Of course, during the step 4e the lateral metallisations forming the receiving areas 160 and the connections 150 between PV cells and TSC only are defined since the Middle TSVs have already been formed.

As regards the options relating to the TSVs executed from the rear face, i.e. the «Last TSVs», an option compatible with all the preceding options, i.e. those relating to the substrate, the metallisation and the «Middle TSVs», consists in not completely filling such TSVs. A compliant layer of metal is then deposited onto the sides of the TSV etching to form a conducting coating, for example having the shape of a cylindrical jacket, which is generally called a «liner».

Another optional execution of the «Last TSVs», which is compatible with the options wherein we start from «bulk» substrates only, consists in executing the «Middle TSVs» and the «Last TSVs» at the same time in the starting «bulk» substrate 105. The TSVs are then all identical and it is no longer necessary, nor even possible, to distinguish the same.

The options relating to the P+ doping such as those described while referring to FIG. 3 wherein a continuous P+ layer 310 is obtained may be applied. The same remarks and advantages relating to the structure obtained also apply.

FIGS. 5a to 5h disclose a third embodiment of the invention wherein the PV islands are interconnected by the rear faces thereof using TSVs. The advantage of such embodiment is specifically that it makes it possible to connect the PV cells by the rear faces thereof, which eliminates the shading of the cells on the front faces thereof, as is the case in the other embodiments.

Figure 5A:
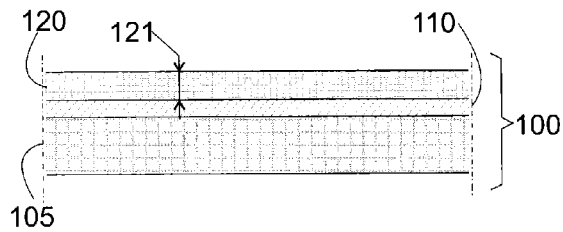
FIGS. 5a to 5h disclose a third embodiment of the invention wherein the PV islands are interconnected by the rear faces thereof using TSV.

As shown in FIG. 5a the starting point is the same as above, i.e. a SOI type substrate 100 with a layer 120 of P doped silicon having a thickness 121 of 10 to 160 μm, and preferably having a thickness of 80 μm, on a buried oxide layer (BOX) 110.

Figure 5E:
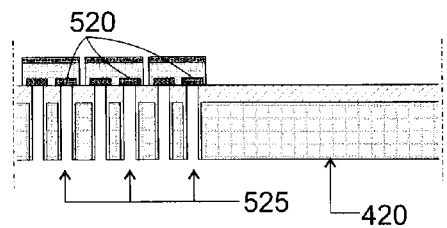
Figure 5B:
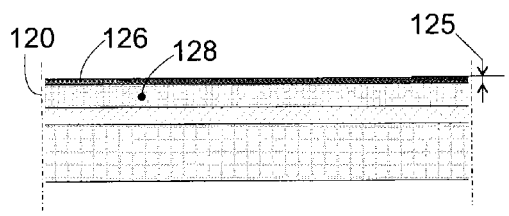

Then, as shown in FIG. 5b, an implantation is executed for a P+ type doping, this time, from the surface, of a layer having a thickness 125. An activation, which, as mentioned above, consists in making dopants electrically active in a semi-conductor, may be executed using laser or «fast-annealing». The aim of the P+ conducting layer is to prevent the recombinations which might result from surface defects.

Figure 5F:
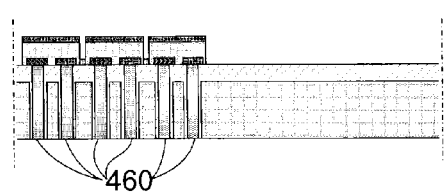
Figure 5C:
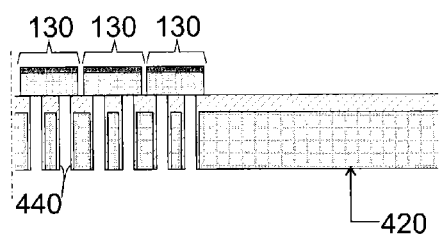

As illustrated in FIG. 5c, a deep etching is then executed from the front face to separate the silicon of the layer 120 into insulated islands 130. Then a deep etching is executed from the rear face 420 to form TSVs. The openings thus formed extend perpendicularly to the substrate. They are formed under the islands 130 so as to reach under the base of an island 130 on the semi-conducting layer 120. Each island 130 is associated with two openings.

As mentioned above insulating material 130 is deposited, then etched anisotropically by so-called «etch-back» etching which leaves the insulating material on the vertical sides 440 only.

Figure 5G:
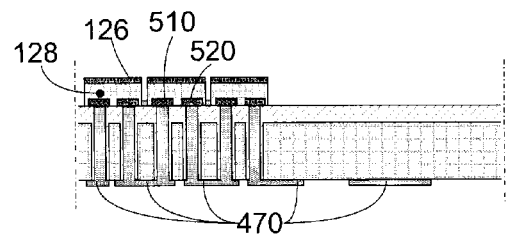
Figure 5D:
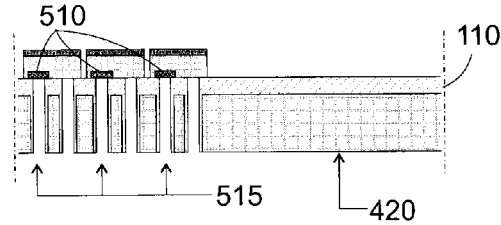

Then, as illustrated in FIG. 5d, an implantation is executed from the rear face on half 515 the openings intended to receive the TSVs for N+ type doping the areas 510 of the layer 120 located opposite such openings. Each island 130 is thus associated with an opening extended by an N+ type implantation. Activation may be executed by laser or «fast-annealing». The PV diodes are thus created, this time at the interface with the BOX layer 110.

As shown in FIG. 5e, a second implantation is similarly executed, i.e. from the rear face on the other half 525 of the openings intended to receive the TSVs for P+ type doping the areas 520 of the layer 120 located opposite such openings for obtaining a good electrical contact. Each island 130 is thus associated with an opening extended by a P+ type implantation. As mentioned above, activation may be executed by laser or « fast-annealing » . Such P+ type doping, although advantageous, is only optional. The P+ areas (or respectively the N+ areas) are doped first after etching the openings from the rear face, only at the P+(or respectively N+) areas. The openings on the N+(or respectively P+) areas are executed then. N+(or respectively P+) type doping is executed. The N+(or respectively P+) doping level is of at least an order of magnitude smaller than P+(or respectively N+) doping so as not to be sufficient to make a reverse doping of the already executed N+(or respectively P+) area.

FIGS. 5f and 5g respectively show the filling of the « last TSV » type through vias 460 from the rear face and the forming of metallic lines 470 on the rear face. The latter may be structured by « lift-off » as mentioned above.

The metallic lines 470 comprise the connections 471 used for electrically connecting the PV cells together. More precisely each connection 471 electrically connects a TSV connected to a N+ implanted area of a first island 130 to another TSV connected to a P+ implanted area of a first island 130 which is preferably adjacent to the first island 130.

The metallic lines 470 also comprise the receiving areas 472 for electrically connecting the PV cells with an external integrated circuit 480 transferred onto the rear face of the substrate 105.

Figure 5H:
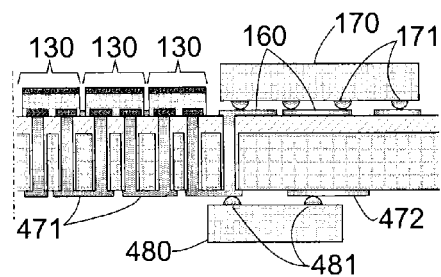

As illustrated in FIG. 5h, one or several external integrated circuit(s), for example 170 and 480, may be transferred, optionally, on either one or on both faces of the substrate containing the photovoltaic islands 130 using, for example, the « flip-chip » technique as schematically shown, or using any other transfer and connection technique, such as « wire-bonding » .

The optional executions described in the previous embodiments apply to the third embodiment of the invention disclosed in FIGS. 5a to 5h. More particularly, the starting SOI structure may be executed using already disclosed options. The « last TSVs » may be filled totally or in the form of a « liner » as already described, too. « middle TSV » type TSVs, may also be executed from the front face, if necessary in such third embodiment.

A first option consists in starting from a SOI substrate.

Alternatively, starting from an oxidized bulk substrate is possible as explained above. Molecular gluing is then used to transfer a P type oxidized bulk substrate. Molecular gluing is then executed between the two oxides, the transferred substrate is then thinned so as to preferably leave only 10 to 160 μm and preferably 80 μm of Si[1]. Such technique makes it possible to reconstitute an equivalent 501 substrate from two bulk substrates.

[1] Ndt: erreur dans le texte source? pour ne laisser de préférence que 10 à 160 μm de Si de type et de préférence 80 μm FIGS. 6a to 6i disclose a fourth embodiment of the invention. Such embodiment is particularly advantageous when no other element relative to the architecture and the packaging of the complete system justifies the utilisation of vias going through the « TSV » type substrate. In this case, the number of steps of the silicon method and of the assembling is reduced, and the handling of the chips is simpler since no thinning is required.

Figure 6A:
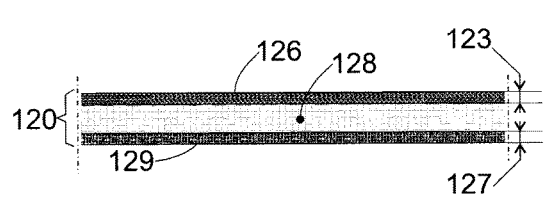
FIGS. 6a to 6i disclose a fourth embodiment of the invention.

As shown in FIG. 6a, we start from a P type substrate 120 having a thickness ranging from 10 to 160 μm and preferably having a thickness of 80 μm, type N+ doped 123 on its front face and type P+ doped 127 on its rear face. The substrate is held by a silicon handle (not shown) on the rear face 127. The N+ doped portion bears reference 126, the P doped portion bears reference 128 and the P+ doped portion bears reference 129 in FIG. 6a. The P+ portion 129 will be useful afterwards to produce an ohmic contact to the P layer 128 and prevent a contact of the Schottky type. The P+ portion creates a repulsive field for the electrons on the rear face.

Figure 6E:
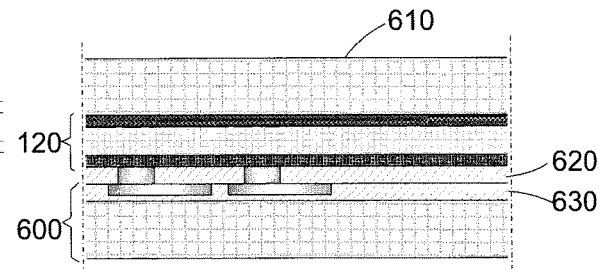
Figure 6B:
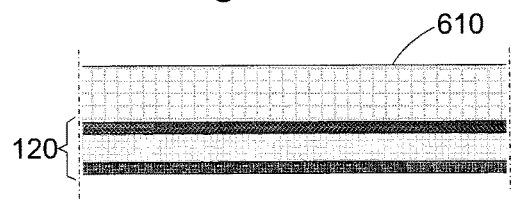

Then, as shown in FIG. 6b a handle preferably made of silicon 610 is glued on the front face of such substrate. At this stage, the handle initially present on the rear face 127 is suppressed.

Figure 6F:
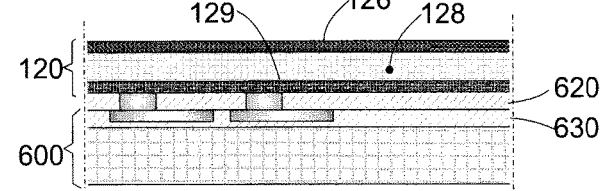
Figure 6C:
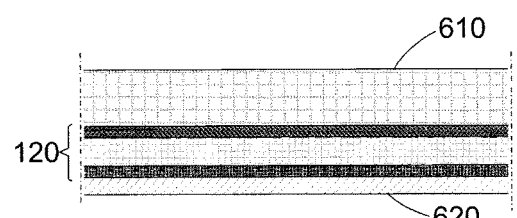

At the following step, illustrated by FIG. 6c, a layer 620 of an insulating material, for example silicon oxide (SiO2) is deposited on the rear face.

Figure 6G:
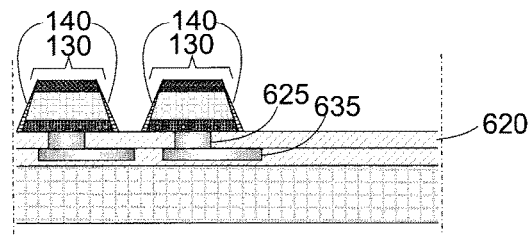
Figure 6D:
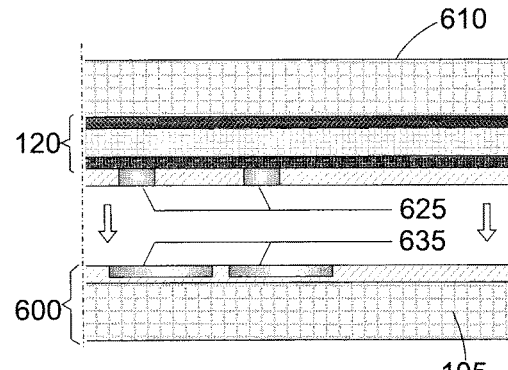

As shown in FIG. 6d the layer 620 of SiO2 of the rear face is structured and metal flattened by CMP is deposited for obtaining transversal metallic pads 625. Such transversal metallic pads 625 go right through the insulating layer. Thus they are electrically connected to the P+ doped layer. The rear face of the substrate 120 is placed opposite a substrate 600 having insulated lateral metallic pads 635 in a layer 630 made, for example, of SiO2. Such lateral metallic pads 635 mainly extend in one plane parallel to that of the stack 600. Such lateral metallic pads 635 laterally extend so as to have at least one first portion located opposite an island 130 and at least one second portion not located opposite the same island 130.

FIG. 6e illustrates the assembling of the two substrates 120, 600 which are made integral with each other. Such connection is preferably executed by gluing the metallic pads 625 and 635 thereof, at a temperature of about 350° C. For this purpose, the transversal metallic pads 625 are located opposite the metallic pads 635 when the two substrates 120, 600 are facing each other.

FIG. 6f illustrates the structure obtained after removing the handle 610. The handle is removed using the so-called « smart cut » technique (creation of an embrittlement area at the interface between the handle and the N+ doped layer for example by implantation of ions then breaking of the embrittlement area) using a chemical-mechanical polishing (CMP) and using grinding or mechanical erosion, if so required.

FIG. 6g shows the result of the structuring by lithography and the etching of the initial substrate 120 to produce the islands 130 of PV cells therein. Etching is stopped at the insulating layer 620. As mentioned above, the etching may be « wet » , for example using a solution of KOH, in which case the etching is executed isotropically and, as shown, slanting sides are obtained. The etching may also be « dry » in which case it is anisotropic and sides perpendicular to the plane of the substrate are obtained. Insulating material is deposited on the whole plate and then etched anisotropically to form spacers 140 on the sides of the islands.

Figure 6H:
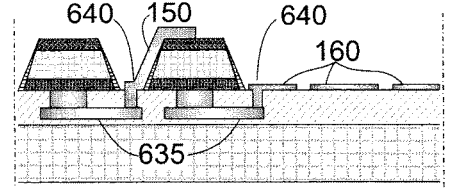

As shown in FIG. 6h the layer 620 is etched to form the connections 150 executed from the front face. Such connections 150 comprise a part 640 filling a cavity etched in the insulating layer 620 and reaching the lateral metallic pad 635. Typically, the cavities are filled with metal, for example copper (Cu). The part 640 extends vertically opposite said second portion of the lateral metallic pad 635, the second portion of the lateral metallic pad 635 which is not located opposite the island 130.

The connections 150 also comprise a segment connecting the N+ area of a cell to the part 640 of the connection 150.

During this sequence of steps, the metallic lines 150 used to electrically connect the PV cells together are thus produced. More precisely, each connection 150 electrically connects a lateral metallic pad 635 connected to the P+ doped area of a PV cell to the N+ doped area of another PV cell.

During this sequence of steps, the receiving areas 160 are also produced to electrically connect the PV cells with an external integrated circuit 170 transferred onto the front face of the layer 105, i.e. the face of the stack whereon the islands 130 are formed.

Prior to filling the cavities with metal such as copper anti-diffusion layers can be deposited. The metal is etched or structured preferably by «lift-off».

Figure 6I:
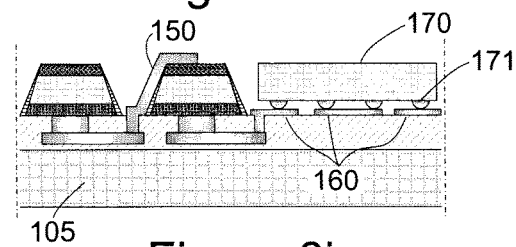

FIG. 6i shows how, as mentioned above, an external integrated circuit 170 can be transferred onto the substrate containing the photovoltaic islands for example, as shown, using the «flipchip» technique or any other transfer and connection technique, such as «wire-bonding».

The embodiments described above provide solutions easily implemented by separately manufacturing the photovoltaic device and the integrated circuit and then by mechanically and electrically assembling these. The manufacturing of the PV cells is thus not constrained by the manufacturing of the integrated circuit. The performances thereof can thus be easily improved and the energy efficiency of the supply of the integrated circuit can be increased.

The invention is not limited to the embodiments described above and extends to all the embodiments covered by the claims.

Specifically, the embodiments described while referring to the Figures provide for devices comprising, each, several PV cells. The invention also extends to the embodiments wherein the device comprises only one PV cell. In such case, the device comprises no second connections but only first connections.

The invention claimed is:

1. A method for manufacturing a photovoltaic device comprising at least one photovoltaic cell (PV cell) connected to an electronic integrated circuit, the method comprising the following steps:
   providing a stack comprising a substrate topped with an insulating layer and a semi-conducting layer, the semi-conducting layer comprising at least one upper portion extending from an upper face of the semi-conducting layer and having a P or N doping, and a lower portion located under the upper portion and having a P or N doping opposite to the doping of the upper portion;
   forming the at least one PV cell in the stack by etching the semi-conducting layer so as to form one or more island(s) distant from each other, each island comprising a superimposition of the lower and upper portions of the semi-conducting layer, and having a front face formed by the upper portion, each island forming a respective PV cell;
   forming first connections comprising at least one receiving area located on a front face of the insulating layer, intended to electrically connect the at least one PV cell with the electronic integrated circuit; and
   transferring, onto said stack comprising the at least one PV cell, a previously manufactured electronic integrated circuit, with the step of transfer being executed so as to electrically connect the at least one receiving area with an electrical contact area carried by the electronic integrated circuit,
   wherein the step of forming each island by etching the semi-conducting layer is executed so as to preserve, at the root of each island a contact area formed in said lower portion of the semi-conducting layer and which is not located under said upper portion,
   wherein the contact area is doped so as to make it electrically conducting.

2. The method according to claim 1, wherein the photovoltaic device comprises a plurality of PV cells, further comprising forming a plurality of second electric connections to interconnect the plurality of PV cells by forming an electric connection connecting the contact area of a PV cell to said front face of another PV cell.

3. A method for manufacturing a photovoltaic device comprising at least one photovoltaic cell (PV cell) connected to an electronic integrated circuit, the method comprising the following steps:
   providing a stack comprising a substrate topped with an insulating layer and a semi-conducting layer, the semi-conducting layer comprising at least one upper portion extending from an upper face of the semi-conducting layer and having a P or N doping, and a lower portion located under the upper portion and having a P or N doping opposite to the doping of the upper portion;
   forming the at least one PV cell in the stack by etching the semi-conducting layer so as to form one or more island(s) distant from each other, each island comprising a superimposition of the lower and upper portions of the semi-conducting layer, and having a front face formed by the upper portion, each island forming a respective PV cell;
   forming first connections comprising at least one receiving area located on a front face of the insulating layer, intended to electrically connect the at least one PV cell with the electronic integrated circuit; and
   transferring, onto said stack comprising the at least one PV cell, a previously manufactured electronic integrated circuit, with the step of transfer being executed so as to electrically connect the at least one receiving area with an electrical contact area carried by the electronic integrated circuit,
   wherein the stack comprising a substrate topped with an insulating layer is obtained by executing the following steps from a massive substrate made of a semi-conducting material:
   N or P type doping of an upper part of the massive substrate to form the insulating layer of said stack;
   transfer onto the upper part of a semi-conducting layer having a doping opposite that of the upper part of the massive substrate;
   thinning of said transferred semi-conducting layer;
   doping of the upper face of said transferred semi-conducting layer so that such transferred semi-conducting layer has an upper portion extending from the upper face thereof and having an opposite doping of a lower portion formed by the rest of said transferred semi-conducting layer.

4. A method for manufacturing a photovoltaic device comprising at least one photovoltaic cell (PV cell) connected to an electronic integrated circuit, the method comprising the following steps:
   providing a stack comprising a substrate topped with an insulating layer and a semi-conducting layer, the semi-conducting layer comprising at least one upper portion extending from an upper face of the semi-conducting layer and having a P or N doping, and a lower portion located under the upper portion and having a P or N doping opposite to the doping of the upper portion;

forming the at least one PV cell in the stack by etching the semi-conducting layer so as to form one or more island(s) distant from each other, each island comprising a superimposition of the lower and upper portions of the semi-conducting layer, and having a front face formed by the upper portion, each island forming a respective PV cell;

forming first connections comprising at least one receiving area located on a front face of the insulating layer, intended to electrically connect the at least one PV cell with the electronic integrated circuit; and transferring, onto said stack comprising the at least one PV cell, a previously manufactured electronic integrated circuit, with the step of transfer being executed so as to electrically connect the at least one receiving area with an electrical contact area carried by the electronic integrated circuit, wherein the step of forming each island by etching the semi-conducting layer is executed so as to preserve, at the root of each island a contact area formed in said lower portion of the semi-conducting layer and which is not located under said upper portion, wherein the contact area is doped so as to make it electrically conducting, wherein the stack comprising a substrate topped with an insulating layer and a semi-conducting layer is a substrate of the silicon on insulator (SOI) type wherein the insulating layer is made of a silicon oxide and wherein a step of doping the upper face of the semi-conducting layer is executed from the SOI substrate, so that the semi-conducting layer comprises said upper portion having a doping opposite that of said lower portion formed by the rest of the semi-conducting layer, and wherein said lower portion is formed of a first thickness portion having a P or N doping and another also P respectively N doped thickness portion but the doping level of which is at least 100 times greater than that of the first portion and is at least equal to 1 atom of the doping species for less than 1,000 atoms of the material forming the semi-conducting layer (P+ respectively N+ doping), said other portion being located between the insulating layer and said first P respectively N doped thickness portion and wherein said other thickness portion is in contact with the insulating layer and with said first thickness portion.

5. A method for manufacturing a photovoltaic device comprising at least one photovoltaic cell (PV cell) connected to an electronic integrated circuit, the method comprising the following steps:

providing a stack comprising a substrate topped with an insulating layer and a semi-conducting layer, the semi-conducting layer comprising at least one upper portion extending from an upper face of the semi-conducting layer and having a P or N doping, and a lower portion located under the upper portion and having a P or N doping opposite to the doping of the upper portion;

forming the at least one PV cell in the stack by etching the semi-conducting layer so as to form one or more island(s) distant from each other, each island comprising a superimposition of the lower and upper portions of the semi-conducting layer, and having a front face formed by the upper portion, each island forming a respective PV cell;

forming first connections comprising at least one receiving area located on a front face of the insulating layer, intended to electrically connect the at least one PV cell with the electronic integrated circuit; and transferring, onto said stack comprising the at least one PV cell, a previously manufactured electronic integrated circuit, with the step of transfer being executed so as to electrically connect the at least one receiving area with an electrical contact area carried by the electronic integrated circuit, wherein said providing a stack comprises providing a first substrate containing said PV cell;

providing a second substrate including a bulk substrate with an insulating layer thereon; and joining the first and second substrate, further comprising, prior to said joining, forming transverse metal pads in the first substrate, and forming lateral metal pads in the second substrate, wherein said joining comprises bonding the transverse metal pads to the lateral metal pads.

* * * * *